(12) United States Patent
Kim et al.

(10) Patent No.: US 9,552,999 B2
(45) Date of Patent: Jan. 24, 2017

(54) PACKAGED ELECTRONIC DEVICE HAVING REDUCED PARASITIC EFFECTS AND METHOD

(71) Applicant: Amkor Technology, Inc., Tempe, AZ (US)

(72) Inventors: Tae Ki Kim, Seoul (KR); Byong Jin Kim, Gyeonggi-do (KR); Ji Young Chung, Gyeonggi-do (KR); Gi Jeong Kim, Gyeonggi-do (KR); Won Bae Bang, Gyeonggi-do (KR)

(73) Assignee: Amkor Technology, Inc., Tempe, AZ (US)

( * ) Notice: Subject to any disclaimer, the term of this patent is extended or adjusted under 35 U.S.C. 154(b) by 0 days.

(21) Appl. No.: 14/967,293

(22) Filed: Dec. 12, 2015

(65) Prior Publication Data

US 2016/0225687 A1 Aug. 4, 2016

(30) Foreign Application Priority Data

Jan. 29, 2015 (KR) ........................ 10-2015-0014266

(51) Int. Cl.
*H01L 21/48* (2006.01)
*H01L 23/522* (2006.01)
(Continued)

(52) U.S. Cl.
CPC ....... *H01L 21/4853* (2013.01); *H01L 23/3107* (2013.01); *H01L 23/49503* (2013.01);
(Continued)

(58) Field of Classification Search
CPC ............... H01L 23/4952; H01L 21/563; H01L 23/3107; H01L 23/49503; H01L 23/49548; H01L 23/49513; H01L 23/49838; H01L 23/645; H01L 23/49541; H01L 21/4821; H01L 28/10; H01L 21/56; H01L 23/28
See application file for complete search history.

(56) References Cited

U.S. PATENT DOCUMENTS 7,005,325 B2 * 2/2006 Chow ............... H01L 21/56
257/676
8,551,820 B1 * 10/2013 Foster ............... H01L 24/97
257/666

(Continued)

FOREIGN PATENT DOCUMENTS

CN 102543907 A 4/2012
JP 2008-507123 A 3/2008
JP 2010-166100 A 7/2010

*Primary Examiner* — Alonzo Chambliss
(74) *Attorney, Agent, or Firm* — Kevin B. Jackson

(57) ABSTRACT

In one embodiment, an electronic package includes a substrate having a die pad plurality of lands embedded within substrate encapsulant. An electronic chip including an electronic component is connected to the die pad. The die pad is configured with a recessed well extending from a top surface of the die pad towards a bottom surface of the die pad. The electronic component is position at least proximate to and overlapping the recessed well to increase the distance between the die pad and the electronic component. In one embodiment, the electronic component includes a passive component, such as an inductor. A package body encapsulates the electronic chip and top surfaces of the substrate, and is further disposed within the recessed well. The die pad bottom surface is continuous below the recessed well.

20 Claims, 3 Drawing Sheets

(51) Int. Cl.
*H01L 23/495* (2006.01)
*H01L 23/64* (2006.01)
*H01L 23/31* (2006.01)
*H01L 23/66* (2006.01)
H01L 23/28 (2006.01)
H01L 21/56 (2006.01)

(52) U.S. Cl.
CPC .. *H01L 23/49541* (2013.01); *H01L 23/49548* (2013.01); *H01L 23/5227* (2013.01); *H01L 23/645* (2013.01); *H01L 23/66* (2013.01); H01L 21/4821 (2013.01); H01L 21/56 (2013.01); H01L 23/28 (2013.01); H01L 23/4952 (2013.01)

(56) References Cited

U.S. PATENT DOCUMENTS

| | | |
|---|---|---|
| 2005/0285262 A1 | 12/2005 | Knapp et al. |
| 2008/0191361 A1 | 8/2008 | Six et al. |
| 2009/0191702 A1* | 7/2009 | Nishimura ........ H01L 23/49503 438/617 |

* cited by examiner

PACKAGED ELECTRONIC DEVICE HAVING REDUCED PARASITIC EFFECTS AND METHOD

CROSS-REFERENCE TO RELATED APPLICATIONS

This application claims priority from Korean Patent Application No. 10-2015-0014266 filed on Jan. 29, 2015 in the Korean Intellectual Property Office, and all the benefits accruing therefrom under 35 U.S.C. §119, the contents of which in its entirety are herein incorporated by reference.

BACKGROUND

The present invention relates, in general, to electronics, and more particularly, to semiconductor packages, structures thereof, and methods of forming semiconductor packages.

Electronic devices, such as semiconductor dies, are conventionally enclosed in plastic packages that protect the semiconductor die from hostile environments, and that enable electrical interconnection between the semiconductor die and a next level of assembly, such as a printed circuit board (PCB) or motherboard. The elements of a typical electronic package include a conductive leadframe or substrate, an integrated circuit or semiconductor die, conductive structures, such as bond wires or solder balls that electrically connect pads on the semiconductor die to individual leads of the leadframe or substrate, and a hard plastic encapsulant material that covers the other components and forms an exterior of the semiconductor package commonly referred to as the package body. Portions of the individual leads can be exposed to electrically connect the package to the next level assembly.

In the past, parasitic coupling or parasitic effects between the various package components and the semiconductor die have caused performance and reliability problems. Previous attempts to address the parasitic effects have resulted in degrading other important packaging parameters, such as thermal characteristics (e.g., ambient thermal resistance (Theta JA) and maximum junction temperature (TJMax)) as well as other characteristics.

Accordingly, it is desirable to have a structure and method for forming packaged electronic devices that reduce parasitic effects of package components without significantly impacting other packaging parameters including, but not limited to, thermal characteristics. It is further desirable for the structure and method to be cost effective and to support alternative conductive interconnect structures.

Figure 1:
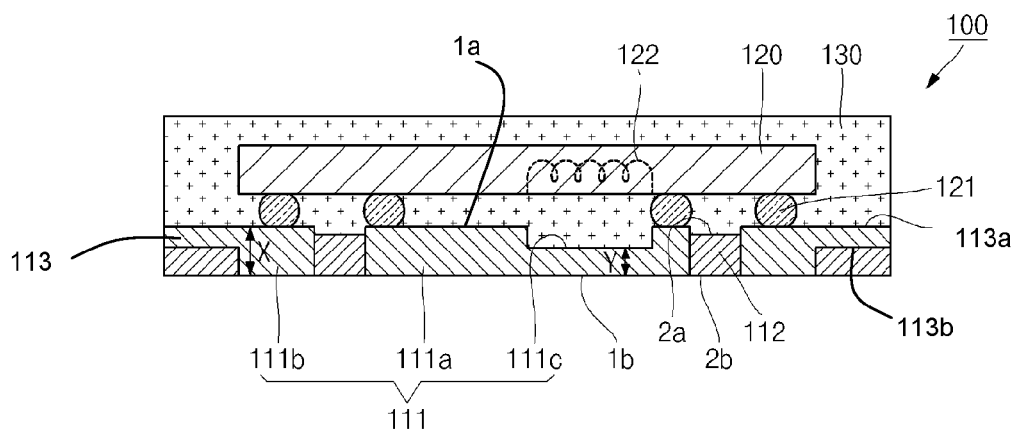
FIG. 1 illustrates a cross-sectional view of an electronic package in accordance with an embodiment of the present invention.

For simplicity and clarity of illustration, elements in the figures are not necessarily drawn to scale, and the same reference numbers in different figures denote generally the same elements. As used herein, the term "and/or" includes any and all combinations of one or more of the associated listed items. In addition, the terminology used herein is for the purpose of describing particular embodiments only and is not intended to be limiting of the disclosure. As used herein, the singular forms are intended to include the plural forms as well, unless the context clearly indicates otherwise. It will be further understood that the terms "comprises," "comprising," "includes," and/or "including," when used in this specification, specify the presence of stated features, numbers, steps, operations, elements, and/or components, but do not preclude the presence or addition of one or more other features, numbers, steps, operations, elements, components, and/or groups thereof. It will be understood that, although the terms first, second, etc. may be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure. Additionally, descriptions and details of well-known steps and elements are omitted for simplicity of the description. It will be appreciated by those skilled in the art that words, during, while, and when as used herein related to circuit operation are not exact terms that mean an action takes place instantly upon an initiating action but that there may be some small but reasonable delay, such as propagation delay, between the reaction that is initiated by the initial action. Additionally, the term while means a certain action occurs at least within some portion of a duration of the initiating action. The use of word about, approximately or substantially means a value of an element is expected to be close to a state value or position. However, as is well known in the art there are always minor variances preventing values or positions from being exactly stated. Unless specified otherwise, as used herein the word over or on includes orientations, placements, or relations where the specified elements can be in direct or indirect physical contact. Unless specified otherwise, as used herein the word overlapping includes orientations, placements, or relations where the specified elements can at least partly or wholly coincide or align in the same or different planes. It is further understood that the embodiments illustrated and described hereinafter suitably may have embodiments and/or may be practiced in the absence of any element that is not specifically disclosed herein.

DETAILED DESCRIPTION OF THE DRAWINGS

The present description includes, among other features, an electronic package comprising a substrate. The substrate includes a die pad having are recessed well or indentation extending from a top surface of the die pad. In one embodiment, the die pad has a die pad bottom surface that is exposed through a bottom surface of the substrate. An electronic die having an electronic component is placed adjacent the die pad such that the electronic component is proximate to and overlaps the recessed well. The recessed well is configured to increase the spacing between the electronic and the die pad thereby reducing parasitic effects or unwanted electrical interaction between the electronic component and the die pad. Additionally, the exposed die pad bottom surface improves thermal characteristics of the electronic package compared to previous devices.

For example, in one embodiment an electronic package structure comprises a substrate. The substrate comprises a die pad having die pad top surface and an opposing die pad bottom surface, wherein the die pad comprises a conductive material. A recessed well is disposed in the die pad partially extending from the die pad top surface towards the die pad bottom surface. The substrate comprises a plurality of lands laterally spaced apart from the die pad and a substrate encapsulant interposed between the die pad and the plurality of lands. In one embodiment, the substrate encapsulant has a substrate top surface and an opposing substrate bottom surface, and the die pad bottom surface and bottom surfaces of the lands are exposed in the substrate bottom surface. An electronic die comprising an electrical component disposed adjacent a major surface of the electronic die is connected to the die pad such that the electrical component is positioned overlapping the recessed well. In one embodiment, a package body encapsulates the electronic die and the substrate top surface and the substrate bottom surface is exposed to the outside.

In another embodiment, the die pad bottom surface comprises a continuous and substantially planar surface and the package body is disposed within the recessed well. In a further embodiment, the electrical component comprises a passive device, such as an inductor; and the recessed well is configured to facilitate a reduction in parasitic effects between the die pad and the passive device. In a still further embodiment, the electronic die is electrically connected to the plurality of lands and the die pad with a plurality of conductive bump structures. In another embodiment, the electronic die is electrically connected to the plurality of lands with a plurality of conductive connective structures. In a further embodiment, the die pad top surface and the substrate top surface reside on different horizontal planes such that the die pad top surface is closer to the electronic die than the substrate top surface. In a still further embodiment, the recessed well has a shape defining a perimeter, and wherein the electrical component is disposed laterally inside the perimeter.

In a further embodiment, a semiconductor package structure comprises a substrate. The substrate comprises a die pad having die pad top surface and an opposing die pad bottom surface. A recessed portion is disposed in the die pad partially extending from the die pad top surface towards the die pad bottom surface, wherein the die pad bottom surface is continuous below the recessed portion. The substrate comprises a plurality of lands spaced apart the die pad and a substrate encapsulant interposed between the die pad and the plurality of lands. The substrate encapsulant has a substrate top surface and an opposing substrate bottom surface, and the die pad bottom surface and bottom surfaces of the lands are exposed in the substrate bottom surface. A semiconductor die comprising an electrical component disposed adjacent a major surface of the semiconductor die, wherein the semiconductor die is connected to the die pad such that the electrical component is positioned at least proximate to and overlapping the recessed portion. A package body encapsulates the semiconductor die and the substrate top surface and the substrate bottom surface is exposed to the outside; and the package body is disposed within the recessed portion.

In a still further embodiment, the die pad comprises four peripheral edge segments, wherein a first peripheral edge segment has a different profile in a plan view than the other peripheral edge segments. In another embodiment, the recessed portion is disposed closer to a second peripheral edge segment that is opposite to the first peripheral edge segment. In a still further embodiment, the die pad and the plurality of lands further comprise a support lead attached thereto, wherein each support lead has a support lead top surface and a support lead bottom surface, and wherein each support lead top surface is exposed in the substrate top surface, and wherein each support lead bottom surface is enclosed within the substrate encapsulant.

In another embodiment, a method for making a semiconductor package structure comprises providing a substrate comprising a die pad having die pad top surface and an opposing die pad bottom surface; a recessed portion disposed in the die pad partially extending from the die pad top surface towards the die pad bottom surface, wherein the die pad bottom surface is continuous below the recessed portion; a plurality of lands spaced apart from the die pad; and a substrate encapsulant interposed between the die pad and the plurality of lands, wherein the substrate encapsulant has a substrate top surface and an opposing substrate bottom surface, and wherein the die pad bottom surface and bottom surfaces of the lands are exposed in the substrate bottom surface. The method includes connecting a semiconductor die to the plurality of lands, wherein the semiconductor die includes an electrical component disposed adjacent a major surface of the semiconductor die, and wherein connecting includes positioning the electrical component at least proximate to and overlapping the recessed portion. The method includes forming a package body encapsulating the semiconductor die and the substrate top surface, wherein the substrate bottom surface is exposed to the outside, and wherein the package body is disposed within the recessed portion.

Various aspects of the present description can be embodied in different forms and should not be construed as being limited to the example embodiments set forth herein. Rather, these example embodiments of the disclosure are provided to convey various aspects of the disclosure to those of ordinary skill in the art.

Figure 2A:
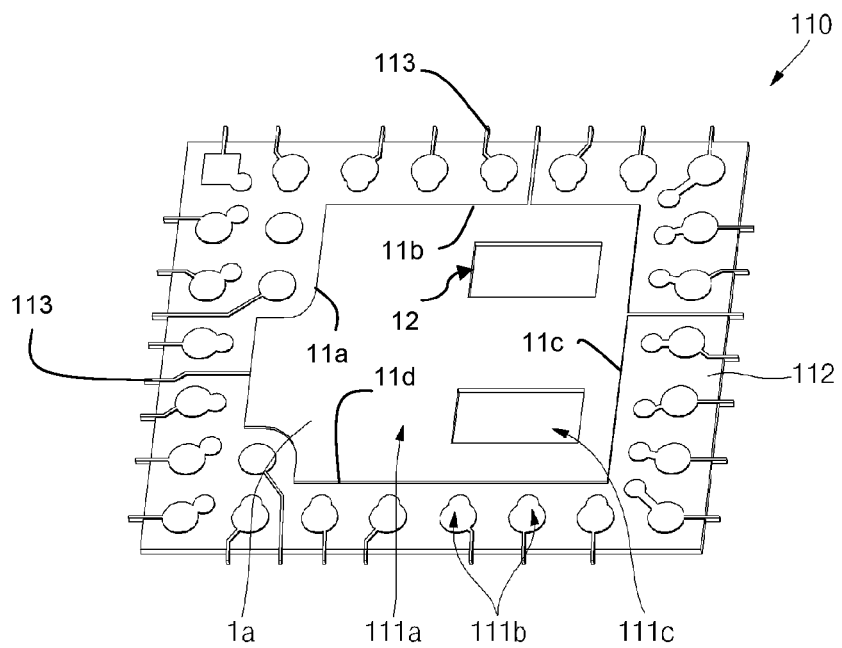
FIGS. 2A and 2B illustrate a plan view and a bottom view respectively of a substrate portion of the electronic package illustrated in FIG. 1.
Figure 2B:
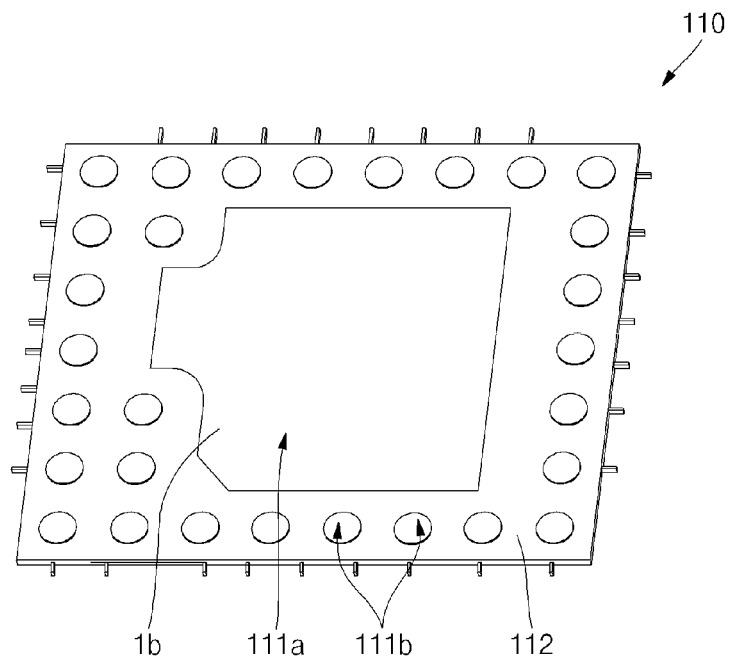
Figure 3:
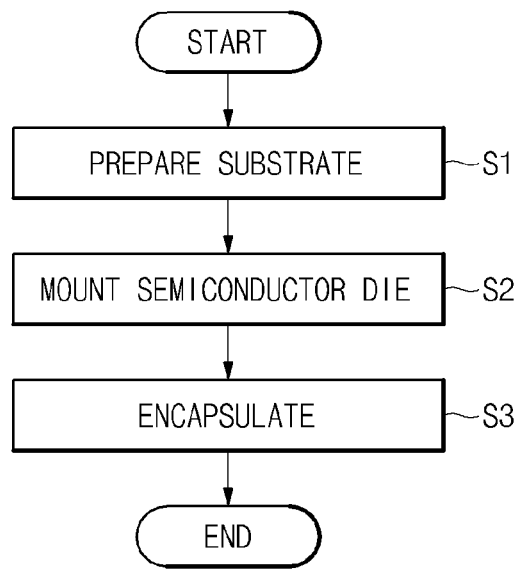
FIG. 3 is a flowchart illustrating a method for manufacturing an electronic package in accordance with an embodiment of the present invention.

FIG. 1 illustrates a cross-sectional view of an electronic package 100, such as a semiconductor package 100, in accordance with a first embodiment. FIGS. 2A and 2B illustrate a plan view and a bottom view respectively of a substrate portion 110 of the semiconductor package 100 illustrated in FIG. 1. FIG. 3 is a flowchart illustrating a method for manufacturing semiconductor package 100 in accordance with one embodiment.

In one embodiment, semiconductor package 100 comprises substrate 110, an electronic device 120, an electronic chip 120, or an electronic die 120, such as a semiconductor die 120, and a package body 130, a molded encapsulant 130, or an encapsulating layer 130. In one embodiment, the semiconductor die 120 can be an integrated circuit device, such as an analog device, a logic device, a mixed-signal device, a power device, a discrete device, a sensor device, an optical device, a similar device as known to those of skill in the art. In accordance with the present embodiment, semiconductor die 120 is provided with one or more electrical components 122, which can be formed on or over a major surface of semiconductor die 120, or it can be formed within the semiconductor material of semiconductor die 120, or a combination thereof. In one embodiment, electrical component 122 comprises a passive device, such as a resistor, capacitor, or inductor, or another device that is sensitive to or that generates parasitic effects, such as inductive or capacitive coupling.

In one embodiment, substrate 110 comprises a conductive substrate portion 111, such as a lead frame 111, and a substrate encapsulant 112 that encapsulates, covers, or encloses, for example, side portions of lead frame 111. In one embodiment, substrate encapsulant 112 comprises an insulating material, such as an epoxy mold compound. In one embodiment, substrate encapsulant 112 includes a substrate top surface 2a that is proximate to semiconductor die 120 and a substrate bottom surface 2b that is exposed to the outside of semiconductor package 100 and not covered by package body 130.

In one embodiment, lead frame 111 comprises a die pad 111a and plurality of lands 111b or lands 111b that are laterally space apart from die pad 111a. In one embodiment, die pad 111a can be in the shape of a substantially planar plate and includes a die pad top surface 1a and an opposing die pad bottom surface 1b. In accordance with the present embodiment, die pad bottom surface 1b comprises a continuous and substantially planar surface preferably with no voids or holes. This feature provides die pad 111a with more surface area for heat transfer compared to previous devices. Lead frame 111 can comprise one or more conductive materials, such as copper, a copper alloy, plated materials, combinations thereof, or similar materials as known to those of skill in the art.

In one embodiment, die pad 111a can have four peripheral edge segments as illustrated in FIGS. 2A and 2B. In one embodiment, one peripheral edge segment 11a can have a different profile in the plan view compared to other peripheral edge segments 11b, 11c, and 11d. In one embodiment, peripheral edge segment 11a has a non-linear profile such that die pad 111a comprises more than four corners. In some embodiments, die pad top surface 1a and the top surfaces of lands 111b are exposed in substrate top surface 2a, and side portions die pad 111a and side portions of lands 111b are at least partially encapsulated or enclosed within substrate encapsulant 112. In some embodiments, die pad top surface 1a and substrate top surface 2a reside on different horizontal planes such that die pad top surface 1a is closer to semiconductor die 120 than substrate top surface 2a is. This feature provides for, among other things, better adhesion between substrate 110 and package body 130. In one embodiment, die pad bottom surface 1b and substrate bottom surface 2b are substantially coplanar or flush with each other. In alternative embodiments, die pad bottom surface 1b and the bottom surfaces of lands 111b can reside on a different horizontal plane than substrate bottom surface 2b. In one embodiment, die pad bottom surface 1b and the bottom surfaces of lands 111b can extend outward from semiconductor package 100 farther than substrate bottom surface 2b. The bottom surfaces of lands 111b and die pad bottom surface 1b are configured for attachment to a next level of assembly, such as printed circuit board or an application board.

In accordance with the present embodiment, die pad 111a further comprises one or more recessed wells 111c, recessed portions 111c, or indentations 111c disposed in die pad 111a partially extending from die pad top surface 1a toward die pad bottom surface 1b. In accordance with the present embodiment, recessed wells 111c do not extend all the way through die pad 111a leaving a portion of die pad 111a between the bottom surface of recessed wells 111c and die pad bottom surface 1b. For example, the thickness X between die pad top surface 1a and die pad bottom surface 1b is greater than the thickness Y between the bottom surface of recessed well 111c and die pad bottom surface 1b.

In accordance with the present embodiment, recessed wells 111c are disposed within die pad 111a in a predetermined manner to be in alignment with electrical component 122 of semiconductor die 120, and are configured to increase the distance between electrical component 122 and die pad top surface 1a. This feature provides for a reduction in parasitic effects between die pad 111a and electrical component 122. In accordance with the present embodiment, recessed wells 111c have a shape defining a perimeter 12 as illustrated in FIG. 2 that provides for electrical component 122 to be disposed laterally inside perimeter 12. In one embodiment, at least one recessed well 111c can placed or disposed closer to peripheral edge segment 11c than to peripheral edge segment 11a. Although recessed wells 111c are illustrated having generally rectangular shapes, it is understood and other shapes can be used in order to accommodate the shape or profile of electrical component 122. Additionally, one or more of the sidewall surfaces of recessed wells 111c can be sloped or curved.

In one embodiment, plurality of lands 111b are spaced apart from the four sides of the die pad 111a and are spaced apart from each other along the respective sides of the die pad 111a. Substrate encapsulant 112 electrically isolates lands 111b from each other. Substrate encapsulant 112 can be provided to better facilitate the handling of substrate 110 during manufacturing steps used to make semiconductor package 100. As illustrated in FIG. 2A, lands 111b can comprise a plurality of different shapes and may further include conductive traces extending from peripheral edge segments. In one embodiment, lands 111b and die pad 111a further comprises a suspension lead 113 or a support lead 113 extending from a peripheral surface towards peripheral edge segments of semiconductor package 100. In one embodiment, support leads 113 include a support lead top surface 113a and a support lead bottom surface 113b, which is recessed with respect to the bottom surfaces of lands 111b as illustrated in FIG. 1. In one embodiment, support lead top surfaces 113a are exposed in substrate top surface 2a and support lead bottom surfaces 113b are encapsulated or enclosed within substrate encapsulant 112 as generally illustrated in FIGS. 1, 2A and 2B.

In one embodiment, semiconductor die 120 is connected to lead frame 111 using conductive bump structures 121. In one embodiment, semiconductor die 120 can have a width that is greater than the width of die pad 111a such that semiconductor die 120 extends to overlap the top surfaces of lands 111b. By way of example, conductive bump structures can be a conductive solder material that electrically connects output pads (not shown) on semiconductor die 120 to top surfaces of lands 111b and to die pad top surface 1a. In accordance with the present embodiment, semiconductor die 120 is connected or attached to lead frame 111 such at that electronic component 122 is positioned overlapping and at least proximate to recessed well 111c so that the distance between electronic component 122 and die pad 111a is greater than if electronic component 122 was placed proximate to another location of die pad 111a away from recessed well 111c.

In one embodiment, package body 130 comprises an insulating material, such as an epoxy mold compound. In accordance with the present embodiment, package body 130 encapsulates, covers, or encloses semiconductor die 120, the top surfaces of lands 111b, die pad top surface 1a while leaving substrate bottom surface 2b, the bottom surfaces of lands 111b, and die pad bottom surface 1b exposed to the outside of semiconductor package 100. In accordance with the present embodiment, package body 130 can be further disposed within recessed wells 111c. In one embodiment, package body 130 completely fills recessed wells 111c to further insulate electronic component 122 from die pad 111a.

With reference now to FIG. 3, a method for manufacturing semiconductor package 100 will be described. In a step S1, a substrate, such as substrate 110, can be prepared or provided. In one embodiment, providing substrate 110 can include providing die pad 111a having die pad top surface 1a and opposing die pad bottom surface 1b. Also, step S1 can include providing a recessed portion 111c disposed in die pad 111a partially extending from die pad top surface 1a towards die pad bottom surface 1b such that die pad bottom surface 1b is continuous below recessed portion 111c. Additionally, step S1 can include providing a plurality of lands 111b spaced apart from die pad 111a. In addition, step S1 can include providing a substrate encapsulant 112 interposed between die pad 111a and plurality of lands 111b such that the substrate encapsulant 112 has a substrate top surface 2a and an opposing substrate bottom surface 2b, and such that die pad bottom surface 1b and bottom surfaces of the lands are exposed in substrate bottom surface 2b.

In another embodiment, providing die pad 111a can include providing the four peripheral edge segments 11a, 11b, 11c, and 11d where peripheral edge segment 11a has a different profile in plan view compared to the other peripheral edge segments 11b, 11c, and 11d. In one embodiment, providing die pad 111a and plurality of lands 111b can comprise providing a support lead 113 attached the die pad and plurality lands 11b, where each support lead 113 has a support lead top surface 113a and a support lead bottom surface 113b.

In a step S2, semiconductor die 120 is connected, attached or mounted to substrate 110. In one embodiment, semiconductor die 120 can be connected to substrate 110 using a plurality of conductive bump structures 120. In an alternative embodiments as will be described in conjunction with FIG. 4, semiconductor die 120 can be attached directly to top surface 1a of die pad 111a using, for example, a conductive adhesive or a conductive solder material, that can be electrically and thermally conductive or electrically insulating but thermally conductive. In accordance with the present embodiments, semiconductor die 120 is connected to substrate 110 so that electrical component 122 is positioned proximate to and overlapping recessed well 111c. In one embodiment, electrical component 122 is positioned to be laterally within the perimeter 12 of recessed well 111c.

In a step S3, package body 130 is provided to encapsulate or enclose, for example, semiconductor die 120 and substrate top surface 2a of substrate encapsulant 112. In one embodiment, package 130 is disposed within recessed well 111c. In another embodiment, substrate bottom surface 2b is exposed to the outside of semiconductor package 100. In one embodiment, package body 130 can be providing using resin molding techniques or other techniques as known to those of skill in the art.

Figure 4:
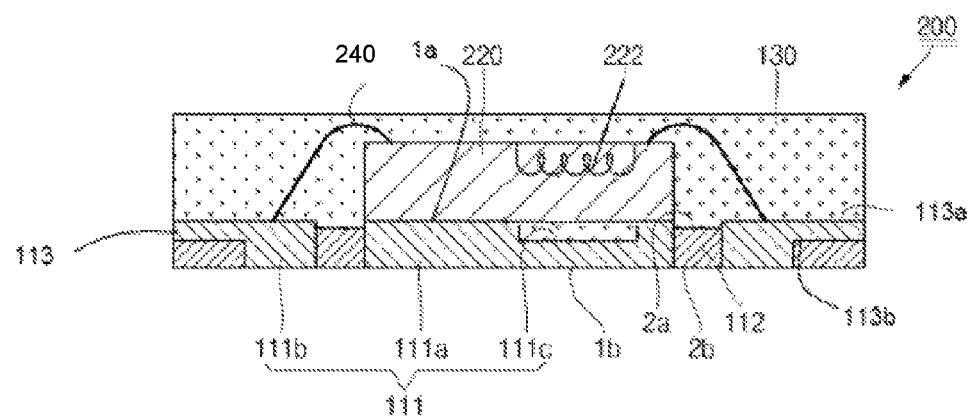
FIG. 4 illustrates a cross-sectional view of an electronic package in accordance with another embodiment of the present invention.

FIG. 4 illustrates a cross-sectional view of an electronic package 200, such as a semiconductor package 200, in accordance with another embodiment. In one embodiment, semiconductor package 200 comprises substrate 110, an electronic device 220, an electronic chip 220, or an electronic die 220, such as a semiconductor die 220, package body 130, and a plurality of conductive connective structures 240, such as conductive wires 240. Substrate 110 and package body 130 of semiconductor package 200 are similar to substrate 110 and package body 130 of semiconductor package 100, and the description of these elements will not be repeated here.

The semiconductor die 220 can be an integrated circuit device, such as an analog device, a logic device, a mixed-signal device, a power device, a discrete device, a sensor device, an optical device, a similar device as known to those of skill in the art. In accordance with the present embodiment, the semiconductor die 220 is provided with one or more electrical components 222, which can be formed on or over a major surface of the semiconductor die 220 or it can be formed within the semiconductor material of the semiconductor die 220. Alternatively, electrical component 222 can be formed on a bottom surface of semiconductor die 220 and connected to the top surface of semiconductor die 220 using connective structures, such as through-semiconductor vias. In one embodiment, electrical component 222 comprises a passive device, such as a resistor, capacitor, or inductor, or another device that is sensitive to or that generates parasitic effects, such as inductive or capacitive coupling.

In accordance with the present embodiment, semiconductor die 220 is attached to die pad 111a using, for example, a solder material or an adhesive material, which can be electrically and thermally conductive or electrically insulating and thermally conductive. In this embodiment, semiconductor die 220 may not extend to overlap the top surfaces of lands 111b. In accordance with the present embodiment, semiconductor die 220 is connected, attached or mounted to die pad top surface 1a so that electrical component 222 is positioned proximate to and overlapping recessed well 111c. In one embodiment, electrical component 222 is positioned to be laterally within the perimeter 12 of recessed well 111c. In accordance with the present embodiment, semiconductor die 220 is connected or attached to lead frame 111 such at that electronic component 222 is positioned overlapping and at least proximate to recessed well 111c so that the distance between electronic component 222 and die pad 111a is greater than if electronic component 222 was placed proximate to another location of die pad 111a away from recessed well 111c. In accordance with the present embodiment, this feature provides for a reduction in parasitic effects, for example, between die pad 111a and electrical component 222.

Conductive connective structures 240 are attached to bond pads or input/output pads (not shown) on the top surface of semiconductor die 220 and to the top surfaces of lands 111b to electrically connect these elements together so that electrical signals can pass back and forth from semiconductor die 222 to a next level of assembly. In one embodiment, conductive connective structures 240 can comprise a conductive material, such as gold, aluminum, copper, or other suitable materials as known to those of skill in the art. In one embodiment, conductive connective structures 240 are enclosed or encapsulated within package body 130 to protect them from the external environment.

In one embodiment, the semiconductor package in accordance with the present description exhibited approximately a 30% reduction in Theta JA compared to previous devices. Additionally, the semiconductor package in accordance with the present description further exhibited approximately a 75% reduction in TJMax compared to previous devices. Thus, the structure and method of the present description shows a significant improvement in thermal performance over previous devices.

In view of all of the above, it is evident that a novel structure and method is disclosed. Included, among other features, is a die pad having one more recessed portions that increase the distance between the die pad an electrical component disposed proximate to the die pad. This reduces parasitic interactions between, for example, the electrical component and the die pad. In one embodiment an encapsulating package body is disposed within the recessed portion to further insulate or isolate the electrical component from the die pad. The die pad bottom surface is a continuous and substantially planar surface thereby improving the thermal characteristics of the semiconductor package compared to prior structures.

While the present invention has been particularly illustrated and described with reference to exemplary embodiments thereof, it will be understood by those of ordinary skill in the art that various changes in form and details can be made therein without departing from the spirit and scope of the present invention as defined by the following claims. By way of example, package body 130 can be configured so that the major surface of semiconductor die 120 opposite to conductive bumps structures 121 is exposed through a top surface of package body 130. Also, the semiconductor packages can be configured as multi-chip packages. It is therefore desired that the present embodiments be considered in all respects as illustrative and not restrictive, reference being made to the appended claims rather than the foregoing description to indicate the scope of the invention.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of the invention. Furthermore, while some embodiments described herein include some but not other features included in other embodiments, combinations of features of different embodiments are meant to be within the scope of the invention and meant to form different embodiments as would be understood by those skilled in the art.

What is claimed is:

1. An electronic package structure comprising:
   a substrate comprising:
      a die pad having a die pad top surface and an opposing die pad bottom surface, wherein the die pad comprises a conductive material;
      a recessed well disposed in the die pad and partially extending from the die pad top surface towards the die pad bottom surface, wherein the recessed well has a shape defining a perimeter;
      a plurality of lands laterally spaced apart from the die pad; and
      a substrate encapsulant interposed between the die pad and the plurality of lands, wherein the substrate encapsulant has a substrate top surface and an opposing substrate bottom surface, and wherein the die pad bottom surface and bottom surfaces of the lands are exposed in the substrate bottom surface;
   an electronic die comprising a passive component disposed adjacent a major surface of the electronic die, wherein the electronic die is coupled to the die pad such that the passive component is positioned overlapping the recessed well and laterally positioned inside the perimeter of the recessed well; and
   a package body encapsulating the electronic die and the substrate top surface, wherein the substrate bottom surface is exposed to the outside.

2. The structure of claim 1, wherein:
   the die pad bottom surface comprises a continuous and substantially planar surface; and
   the package body is disposed within the recessed well.

3. The structure of claim 1, wherein the die pad comprises four peripheral edge segments, wherein a first peripheral edge segment has a different profile in a plan view than the other peripheral edge segments.

4. The structure of claim 3, wherein the recessed well is disposed closer to a second peripheral edge segment than to the first peripheral edge segment, and wherein the second peripheral edge segment is opposite to the first peripheral edge segment.

5. The structure of claim 1, wherein:
   the electronic die comprises a semiconductor die; and
   the recessed well is configured to facilitate a reduction in parasitic effects between the die pad and the passive device.

6. The structure of claim 1, wherein the passive device comprises an inductor.

7. The structure of claim 1, wherein each land further comprises a support lead attached thereto, and wherein each support lead has a support lead top surface and a support lead bottom surface, and wherein each support lead top surface is exposed in the substrate top surface, and wherein each support lead bottom surface is enclosed within the substrate encapsulant, and wherein at least some support leads laterally extend to a peripheral edge of the substrate encapsulant and are exposed to the outside of the package body.

8. The structure of claim 1, wherein the die pad top surface and top surfaces of the plurality of lands are exposed in the substrate top surface, and wherein side portions of the die pad and side portions of the plurality of lands are enclosed within the substrate encapsulant.

9. The structure of claim 1, wherein the die pad top surface and the substrate top surface reside on different horizontal planes such that the die pad top surface is closer to the electronic die than the substrate top surface.

10. The structure of claim 1, wherein the die pad bottom surface and the substrate bottom surface are substantially coplanar.

11. The structure of claim 1, wherein the electronic die is electrically connected to the plurality of lands and the die pad with a plurality of conductive bump structures.

12. The structure of claim 1, wherein a first major surface of the electronic die is coupled to the die pad and an opposing second major surface of the electronic die is electrically connected to the plurality of lands.

13. The structure of claim 1, wherein the die pad and each of the plurality of lands further comprise a support lead attached thereto, wherein each support lead has a support lead top surface and a support lead bottom surface, and wherein each support lead top surface is exposed in the substrate top surface, and wherein each support lead bottom surface is enclosed within the substrate encapsulant, and wherein the plurality of lands comprises a plurality of different shapes.

14. A semiconductor package structure comprising:
   a substrate comprising:
      a die pad having a die pad top surface and an opposing die pad bottom surface;
      a recessed portion disposed in the die pad and partially extending from the die pad top surface towards the die pad bottom surface, wherein the die pad bottom surface is continuous below the recessed portion, and wherein the recessed portion has a shape defining a perimeter;

a plurality of lands spaced apart from the die pad; and
a substrate encapsulant interposed between the die pad and the plurality of lands, wherein the substrate encapsulant has a substrate top surface and an opposing substrate bottom surface, and wherein the die pad bottom surface and bottom surfaces of the lands are exposed in the substrate bottom surface;
a semiconductor die comprising a passive component disposed adjacent a major surface of the semiconductor die, wherein the semiconductor die is coupled to the die pad such that the passive component is laterally positioned inside the perimeter of the recessed portion such that no portion of the passive device overlaps the die pad top surface outside of the recessed portion; and
a package body encapsulating the semiconductor die and the substrate top surface, wherein the substrate bottom surface is exposed to the outside, and wherein the package body is disposed within the recessed portion.

15. The structure of claim 14, wherein:
the passive component comprises an inductor; and
the recessed portion is configured to facilitate a reduction in parasitic effects between the die pad and the inductor.

16. The structure of claim 14, wherein:
the die pad top surface and top surfaces of the plurality of lands are exposed in the substrate top surface;
side portions of the die pad and side portions of the plurality of lands are enclosed within the substrate encapsulant; and
the die pad top surface and the substrate top surface reside on different horizontal planes such that the die pad top surface is closer to the semiconductor die than the substrate top surface.

17. The structure of claim 16, wherein:
the die pad comprises four peripheral edge segments, wherein a first peripheral edge segment has a different profile in a plan view than the other peripheral edge segments;
the recessed portion is disposed closer to a second peripheral edge segment that is opposite to the first peripheral edge segment;
the die pad and each of the plurality of lands further comprise a support lead attached thereto, wherein each support lead has a support lead top surface and a support lead bottom surface, and wherein each support lead top surface is exposed in the substrate top surface, and wherein each support lead bottom surface is enclosed within the substrate encapsulant, and wherein at least some support leads laterally extend to a peripheral edge of the substrate encapsulant and are exposed to the outside of the package body.

18. A method for making a semiconductor package structure comprising:
providing a substrate comprising:
a die pad having a die pad top surface and an opposing die pad bottom surface;
a recessed portion disposed in the die pad and partially extending from the die pad top surface towards the die pad bottom surface, wherein the die pad bottom surface is continuous below the recessed portion, and wherein the recessed portion has a shape defining a perimeter;
a plurality of lands spaced apart from the die pad; and
a substrate encapsulant interposed between the die pad and the plurality of lands, wherein the substrate encapsulant has a substrate top surface and an opposing substrate bottom surface, and wherein the die pad bottom surface and bottom surfaces of the lands are exposed in the substrate bottom surface;
coupling a semiconductor die to the plurality of lands, wherein the semiconductor die includes a passive component disposed adjacent a major surface of the semiconductor die, and wherein coupling includes laterally positioning the passive component inside the perimeter of the recessed portion such that no portion of the passive component overlaps the die pad top surface outside of the recessed portion; and
providing a package body encapsulating the semiconductor die and the substrate top surface, wherein the substrate bottom surface is exposed to the outside, and wherein the package body is disposed within the recessed portion.

19. The method of claim 18, wherein coupling the semiconductor die comprises electrically connecting the semiconductor die and the plurality of lands, wherein the passive component comprises an inductor, and wherein the recessed portion is configured to facilitate a reduction in parasitic effects between the die pad and the passive device.

20. The method of claim 18, wherein providing the substrate comprises:
providing the die pad having four peripheral edge segments, wherein a first peripheral edge segment has a different profile in a plan view than the other peripheral edge segments;
providing the recessed portion comprises disposing the recessed portion closer to a second peripheral edge segment that is opposite to the first peripheral edge segment;
providing the die pad and the plurality of lands comprises providing a support lead attached the die pad and each of the plurality of lands, wherein each support lead has a support lead top surface and a support lead bottom surface; and
providing the substrate encapsulant comprises providing the substrate encapsulant wherein each support lead top surface is exposed in the substrate top surface, and wherein each support lead bottom surface is enclosed within the substrate encapsulant, and wherein at least some support leads laterally extend to a peripheral edge of the substrate encapsulant and are exposed to the outside of the package body.

* * * * *